United States Patent
Liu et al.

(10) Patent No.: US 11,237,221 B2
(45) Date of Patent: Feb. 1, 2022

(54) ACCURATELY POSITIONABLE COMPUTER HOST POWER-ON DETECTION MACHINE

(71) Applicant: DONGGUAN UNIVERSITY OF TECHNOLOGY, Dongguan (CN)

(72) Inventors: Xiaowei Liu, Dongguan (CN); Yongcong Zhang, Dongguan (CN)

(73) Assignee: DONGGUAN UNIVERSITY OF TECHNOLOGY, Dongguan (CN)

( * ) Notice: Subject to any disclaimer, the term of this patent is extended or adjusted under 35 U.S.C. 154(b) by 515 days.

(21) Appl. No.: 16/285,331

(22) Filed: Feb. 26, 2019

(65) Prior Publication Data

US 2020/0003845 A1    Jan. 2, 2020

(30) Foreign Application Priority Data

Jun. 28, 2018    (CN) .......................... 201810690160.1

(51) Int. Cl.
    *G01R 31/40*      (2020.01)
    *G06F 1/26*      (2006.01)
    *G06F 1/18*      (2006.01)

(52) U.S. Cl.
    CPC ............... *G01R 31/40* (2013.01); *G06F 1/26* (2013.01); *G06F 1/189* (2013.01)

(58) Field of Classification Search
    CPC ............ G01R 31/40; G06F 1/26; G06F 1/189
    USPC ......................................... 324/764.01, 750.16
    See application file for complete search history.

(56) References Cited

U.S. PATENT DOCUMENTS

| | | | |
|---|---|---|---|
| 2014/0176070 A1* | 6/2014 | Krammer | H02J 7/00 320/109 |
| 2020/0189413 A1* | 6/2020 | Fagan | H02J 7/0045 |

* cited by examiner

*Primary Examiner* — Vinh P Nguyen
*Assistant Examiner* — Rahul Maini
(74) *Attorney, Agent, or Firm* — Hawaii Patent Services; Nathaniel K. Fedde

(57) ABSTRACT

An accurately positionable computer host power-on detection machine comprises a detection box with an opening on the left side, the detection box is internally connected with a detection discharge block through a lifting device, the right part of the detection discharge block is provided with a positioning interception block, the height of the positioning intercept block is the same as the host and the center of the positioning interception block is provided with a detection port of 0.6-0.8 times the size of the rear side plate of the host, the inner side of the upper plate of the detection box is connected with an upper limit plate through a connecting plate, the detection box is provided with a positioning and clamping device cooperated with the left and right side plates of the host, and the inner side of the right side plate of the detection box is provided with a detection device which enables a detection insert block to move horizontally left and right.

9 Claims, 6 Drawing Sheets

ACCURATELY POSITIONABLE COMPUTER HOST POWER-ON DETECTION MACHINE

FIELD OF THE INVENTION

The present invention relates to the computer field, and more particularly to an accurately positionable computer host power-on detection machine.

BACKGROUND OF THE INVENTION

With the rapid development of the technology, the computer becomes more and more common in use. The computer is roughly divided into desktop and laptop. Desktop computer contains the main body of the computer which needs to be connected to the power supply before use, in order to ensure that the processed computer can be used normally, it is necessary to check the power connection socket thereof and to see whether it can be connected to the power supply for work. The existing detection is mostly detected artificially, through manually inserting the insert block of the computer's connecting wire into the power socket of the computer main body, and connecting the plug part of the connecting wire to the external power source, the computer host is started to judge whether it is powered on, thereby completing the power-on performance detection of the computer, which is of low detection efficiency and unable to achieve automatic detection.

SUMMARY OF THE INVENTION

The present invention aims to provide an accurately positionable computer host power-on detection machine which can accurately position the computer host. Cooperated with the detection device which enables the insert block to move horizontally left and right, the accurately positionable computer host power-on detection machine can achieve the automatic power-on performance detection for computer host, greatly improving the detection efficiency.

In order to achieve the objective above, the technical solutions adopted in the present invention are as follow:

An accurately positionable computer host power-on detection machine, comprising a detection box with an opening on the left side, the detection box is internally connected with a detection discharge block through a lifting device, the right part of the detection discharge block is provided with a positioning interception block, the height of the positioning interception block is the same as the host, and the center of the positioning interception block is provided with a detection port of 0.6-0.8 times the size of the rear side plate of the host, the inner side of the upper plate of the detection box is connected with an upper limit plate through a connecting plate, the detection box is provided with a positioning and clamping device cooperated with the left and right side plates of the host, and the inner side of the right side plate of the detection box is provided with a detection device which enables a detection insert block to move horizontally left and right.

Preferentially, the positioning and clamping device comprises three positioning and clamping motors are arranged side by side in the detection box through brackets, and each of the positioning and clamping motors is connected with a positioning and clamping screw rod which runs forward and backward and passes through the front and rear side plates of the detection box, both the positions where the positioning and clamping screw rod passes through the front and rear side plates of the detection box are sleeved and cooperated with a positioning and clamping movable block, and the winding directions of the two positions are opposite, the outer sides of the front and rear side plates of the detection box are provided with a supporting block of the positioning and clamping movable block cooperated with the positioning and clamping movable block through the sliding rail and the sliding slot, the positioning and clamping movable block is connected with a positioning and clamping column capable of being inserted into the detection box, and the inner end of the positioning and clamping column is of a circular arc shape, and the heights of the three positioning and clamping columns on the same side are all different.

Preferentially, the detection device comprises a detection mounting block arranged in the inner side of the right side plate of the detection box, the detection mounting block is connected with a horizontally-oriented detection feed cylinder, the detection feed cylinder is connected with a detection feed block, the center of the detection feed block is embedded in detection insert block exceeding the left side thereof, the detection insert block is cooperated with the power socket of the host and the height which the detection insert block exceeds the detection feed block is the same as the depth of the power socket, the left side of the detection feed block is provided with a contact sensor, the detection insert block is connected with an electrical connection wire which passes through the detection box, and the electrical connection wire is connected with an external power supply.

Preferentially, the detection mounting block has no connection with the detection box and the upper part of the detection mounting block is connected with a detection movable drawstring capable of passing through the detection box, the detection movable drawstring is connected to a drawstring collecting reel arranged on the outer side of the detection box, the drawstring collecting reel is connected with a collecting reel motor; the inner upper part of the right side plate of the detection box is provided with a detection positioning block, the lower part thereof is provided with a detection limit block, both the detection positioning block and the detection limit block with the right side plate of the detection box respectively form a downwardly opening detection positioning groove and an upwardly opening detection limit groove, the detection positioning groove is cooperated with the upper part of the detection mounting block in a gapless plug-in way, the detection limit groove is cooperated with the detection mounting block with a gap, and the lower part of the detection positioning block is an inclined plane inclined to the upper right.

Preferentially, the lifting device comprises a lifting cylinder hinged separately on the left and right parts of the lower surface of the detection discharge block, and the left part on the bottom plate of the detection box is provided with a slope measuring device cooperated with the detection discharge block.

Preferentially, the lower part of the detection discharge block is fixedly connected with a lifting connection block, the lifting connection block is hinged with a lifting cylinder, both the lower left and right sides of the lifting connection block are provided with a reset movable block, and the right and left sides of the main body of the lifting cylinder are provided with a reset fixed block fittingly cooperated with a reset movable block.

Preferentially, the slope measuring device comprises a slope measuring sleeve arranged at the bottom of the detection box, the slope measuring sleeve is internally provided with a slope measuring hole, the bottom of the slope measuring hole is provided with a pressure gauge, and the slope measuring hole is sleeved and cooperated with a slope measuring ejector, the lower part of the slope measuring ejector is connected with a slope measuring spring, the upper part of the slope measuring spring in connected with a mounting block of measuring spring cooperated with the pressure gauge, the upper part of the slope measuring ejector is provided with a slope measuring top block cooperated with the measuring discharge block, the measuring top block is a hemisphere block with a diameter greater than the slope measuring ejector, and the slope measuring sleeve is provided with a rangefinder cooperated with the lower plane of slope measuring top block.

Preferentially, there are two connecting plates which are sealingly cooperated with the front and rear side plates and the upper plate of the detection box, the center of both two connecting plates is provided with a vent hole, the position where the upper limit plate is located between the positioning interception block and the right side plate of the detection box is also provided with a vent hole, an air pipe is arranged between the two connecting plates to be cooperated with the vent hole, an air pump is arranged below the upper plate of the detection box in cooperation with a vent hole on the left side of the connecting plate, the position in the detection box which is between the vent hole on the right connecting plate and the vent hole on the upper limit plate is connected with a first temperature tester through brackets, and the outer side of the air pipe is provided with a second temperature tester.

Preferentially, the right part of the bottom plate of the detection box is provided with a sealing spring with a vertical direction, the sealing spring is connected with a lower sealing block sealingly cooperated with the right side plate and the front and rear side plates of the detection box, and the left end of the lower sealing block is fittingly cooperated with the lower right part of the detection discharge block.

DETAILED DESCRIPTION OF THE ILLUSTRATED EMBODIMENTS

The text markup shown in the figures are indicated as follow:
1—detection box;
2—lifting device;
3—detection discharge block;
4—host;
5—positioning interception block;
6—detection device;
7—positioning and clamping device;
8—slope measuring device;
9—sealing spring;
10—lower sealing block;
11—connecting plate;
12—upper limit plate;
13—air pipe;
14—air pump;
15—first temperature tester;
16—second temperature tester;
21—positioning and clamping motor;
22—positioning and clamping screw rod;
23—positioning and clamping movable block;
24—positioning and clamping column;
25—supporting block of the positioning and clamping movable block;
31—detection mounting block;
32—detection feed cylinder;
33—detection feed block;
34—detection insert block;
35—electrical connection wire;
36—detection movable drawstring;
37—drawstring collecting reel;
38—detection positioning block;
39—detection limit block;
41—lifting cylinder;
42—lifting connection block;
43—reset movable block;
44—reset fixed block;
45—slope measuring sleeve;
46—pressure gauge;
47—slope measuring spring;
48—slope measuring ejector;
49—slope measuring top block;
50—rangefinder;
51—mounting block of measuring spring.

In order to enable the technicians in the art to better understand the technical solutions of the present invention, the following is a detailed description of the present invention combined with the accompanying drawings. The description in this part is only for demonstration and explanation, and should not limit the scope of protection of the present invention.

Figure 1:
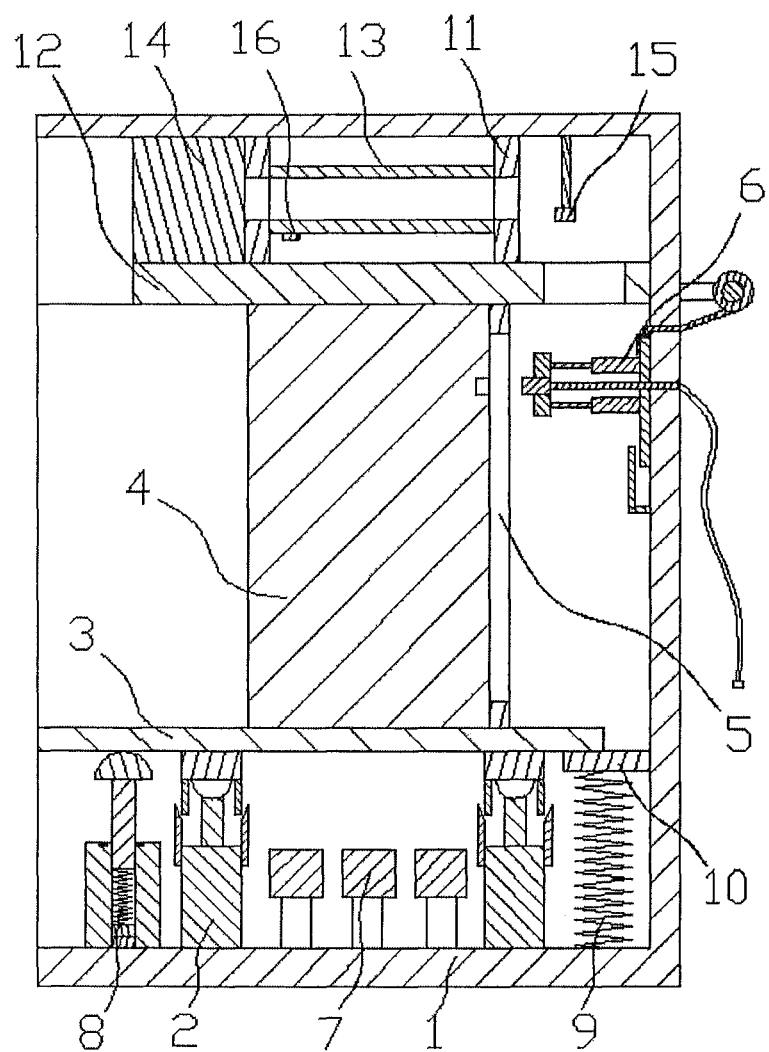
FIG. 1 is the structure schematic view of an accurately positionable computer host power-on detection machine.

As shown in FIG. 1, the specific structure of the present invention is as follow: an accurately positionable computer host power-on detection machine, comprising a detection box (1) with an opening on the left side, the detection box (1) is internally connected with a detection discharge block (3) through a lifting device (2), the right part of the detection discharge block (3) is provided with a positioning interception block (5), the height of the positioning interception block (5) is the same as the host (4), and the center of the positioning interception block (5) is provided with a detection port of 0.6-0.8 times the size of the rear side plate of the host (4), the inner side of the upper plate of the detection box (1) is connected with an upper limit plate (12) through a connecting plate (11), the detection box (1) is provided with a positioning and clamping device (7) cooperated with the left and right side plates of the host (4), and the inner side of the right side plate of the detection box (1) is provided with a detection device (6) which enables a detection insert block (34) to move horizontally left and right.

The computer host can be accurately positioned through cooperating the positioning interception block and the detection discharge block capable of being lifted with the upper limit plate and the positioning and clamping device. Cooperated with the detection device which enables the insert block to move horizontally left and right, the accurately positionable computer host power-on detection machine can achieve the automatic power-on performance detection for computer host, greatly improving the detection efficiency.

Figure 2:
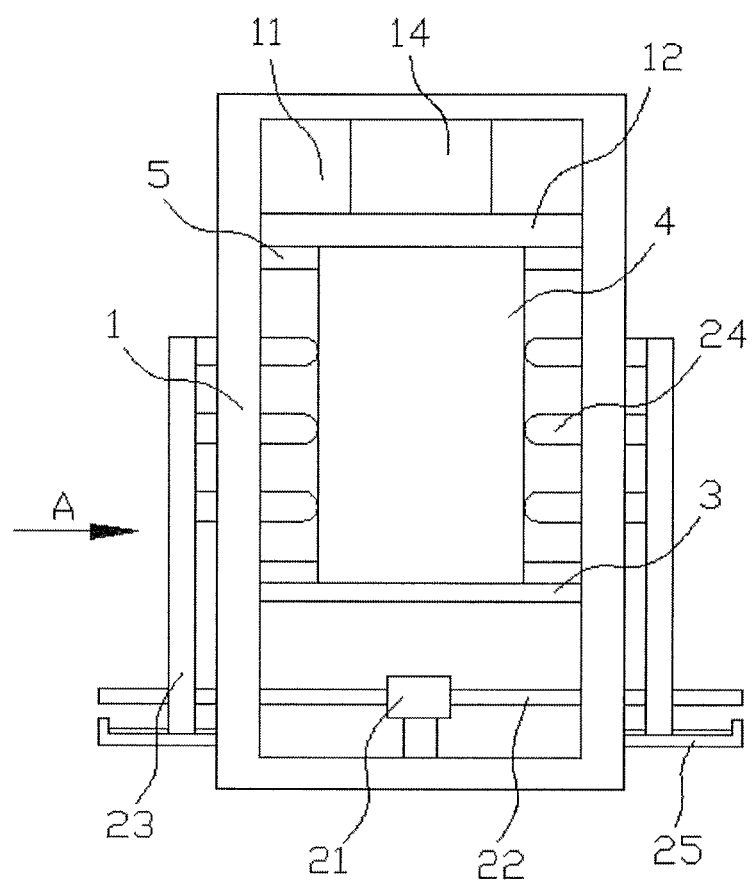
FIG. 2 is the left view of the FIG. 1 without the lifting device and the slope measuring device.
Figure 3:
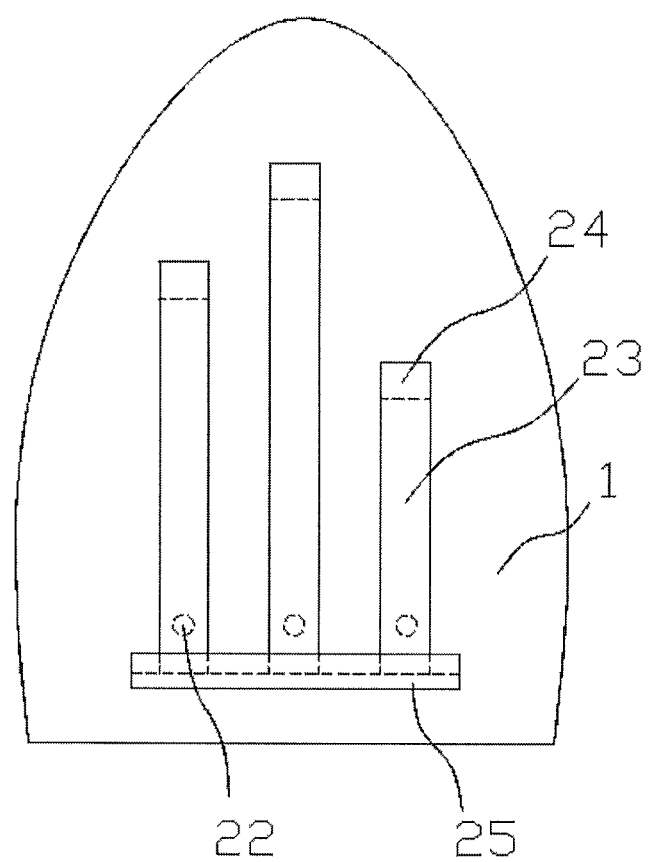
FIG. 3 is the view taken along line A of the FIG. 2.

As shown in FIG. 2-3, the positioning and clamping device (7) comprises three positioning and clamping motors

(21) are arranged side by side in the detection box (1) through brackets, and each of the positioning and clamping motors (21) is connected with a positioning and clamping screw rod (22) which runs forward and backward and passes through the front and rear side plates of the detection box (1), both the positions where the positioning and clamping screw rod (22) passes through the front and rear side plates of the detection box (1) are sleeved and cooperated with a positioning and clamping movable block (23), and the winding directions of the two positions are opposite, the outer sides of the front and rear side plates of the detection box (1) are provided with a supporting block of the positioning and clamping movable block (25) cooperated with the positioning and clamping movable block (23) through the sliding rail and the sliding slot, the positioning and clamping movable block (23) is connected with a positioning and clamping column (24) capable of being inserted into the detection box (1), and the inner end of the positioning and clamping column (24) is of a circular arc shape, and the heights of the three positioning and clamping columns (24) on the same side are all different.

The positioning and clamping device adopts the way of the motor cooperated with the screw rod to clamp and each group of the motor and the screw rod controls a group of the positioning and clamping column to synchronously clamp the left and right sides of the host, the designs for the positioning and clamping device of three groups is able to achieve good positioning and clamping effects of three points, and clamp the host with inclined sides on the right and left well without affecting the host to be lifted along with the detection discharge block.

Figure 4:
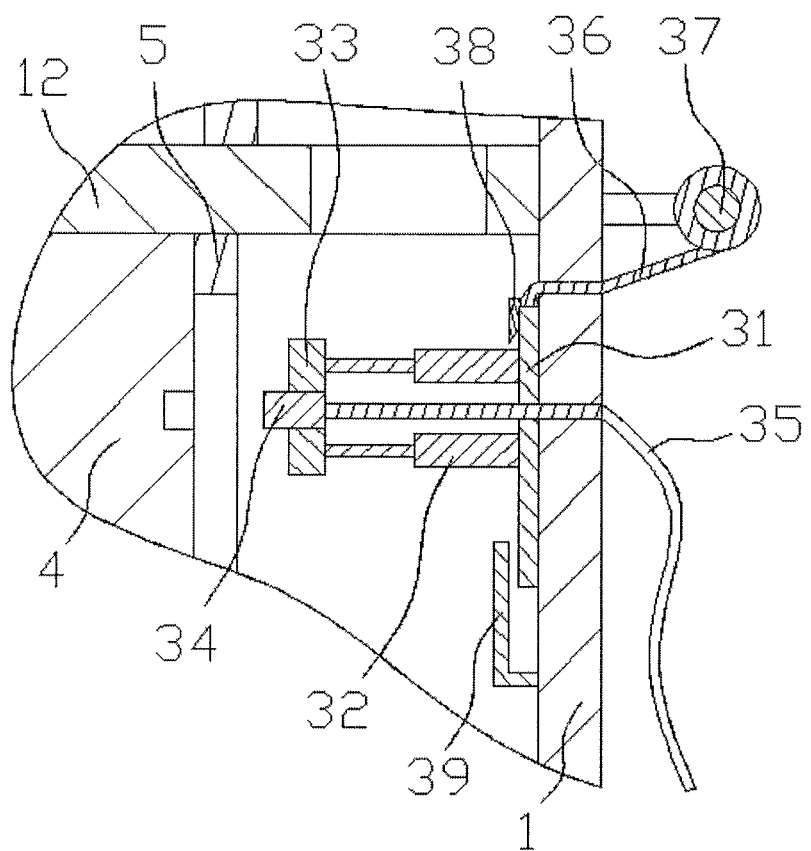
FIG. 4 is the structure schematic view of the detection device.

As shown in FIG. 4, the detection device (3) comprises a detection mounting block (31) arranged in the inner side of the right side plate of the detection box (1), the detection mounting block (31) is connected with a horizontally-oriented detection feed cylinder (32), the detection feed cylinder (32) is connected with a detection feed block (33), the center of the detection feed block (33) is embedded in detection insert block (34) exceeding the left side thereof, the detection insert block (34) is cooperated with the power socket of the host (4) and the height which the detection insert block (34) exceeds the detection feed block (33) is the same as the depth of the power socket, the left side of the detection feed block (33) is provided with a contact sensor, the detection insert block (34) is connected with an electrical connection wire (35) which passes through the detection box (1), and the electrical connection wire (35) is connected with an external power supply.

The detection device through the designs for the detection feed cylinder and the detection feed block is able to ensure the horizontal movement of the detection insert block and ensure that the detection insert block is accurately docked with the power socket of the host, and meanwhile it is also able to detect the depth of the detection movable block through detection insert block and detect the depth of the power socket through the cooperation with contact sensor.

As shown in FIG. 3, the detection mounting block (31) has no connection with the detection box (1) and the upper part of the detection mounting block (31) is connected with a detection movable drawstring (36) capable of passing through the detection box (1), the detection movable drawstring (36) is connected to a drawstring collecting reel (37) arranged on the outer side of the detection box (1), the drawstring collecting reel (37) is connected with a collecting reel motor; the inner upper part of the right side plate of the detection box (1) is provided with a detection positioning block (38), the lower part thereof is provided with a detection limit block (39), both the detection positioning block (38) and the detection limit block (39) with the right side plate of the detection box (1) respectively form a downwardly opening detection positioning groove and an upwardly opening detection limit groove, the detection positioning groove is cooperated with the upper part of the detection mounting block (31) in a gapless plug-in way, the detection limit groove is cooperated with the detection mounting block (31) with a gap, and the lower part of the detection positioning block (38) is an inclined plane inclined to the upper right.

The shaking of the connecting wire is able to be simulated through the drawstring's control over the lowering and the lifting of the detection mounting block, thereby determining whether the tightness of the socket is appropriate, meanwhile through the detection positioning block and detection limit block, it is possible to ensure accurate position determination of the detection insert block before being docked, and also to limit the range of motion of the detection mounting block.

As shown in FIG. 1, the lifting device (2) comprises a lifting cylinder (41) hinged separately on the left and right parts of the lower surface of the detection discharge block (3), and the left part on the bottom plate of the detection box (1) is provided with a slope measuring device (8) cooperated with the detection discharge block (3).

Cooperated with the design of the slope measuring device, the design that both the lifting cylinders on the left and right parts are hinged with the detection discharge block is able to detect at which slope the detection insert block and the power plug are apart, thereby accurately detecting the tightness of the power socket.

Figure 5:
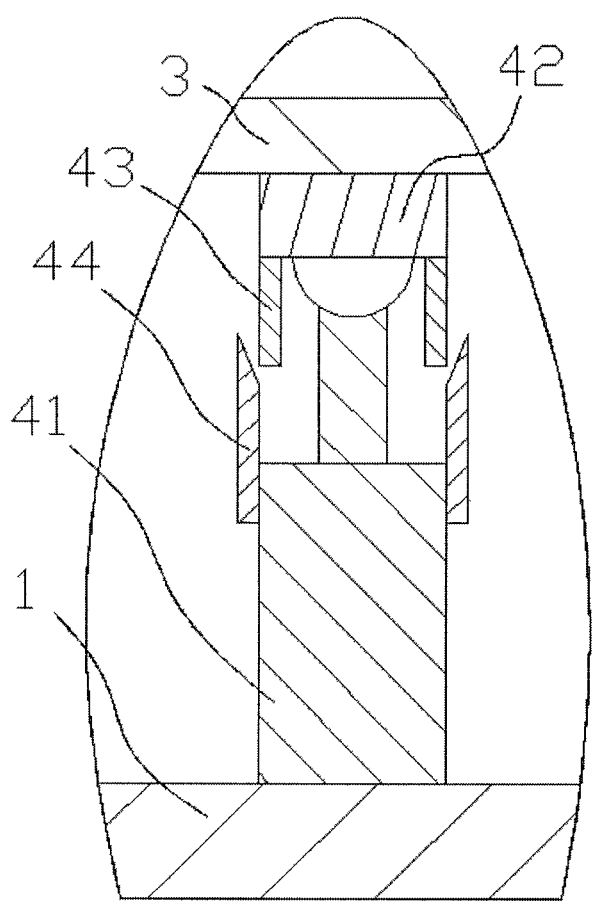
FIG. 5 is the structure schematic view of the lifting device.

As shown in FIG. 5, the lower part of the detection discharge block (3) is fixedly connected with a lifting connection block (42), the lifting connection block (42) is hinged with a lifting cylinder (41), both the lower left and right sides of the lifting connection block (42) are provided with a reset movable block (43), and the right and left sides of the main body of the lifting cylinder (41) are provided with a reset fixed block (44) fittingly cooperated with a reset movable block (43).

Cooperated with the designs of the reset movable block and the reset fixed block, the design of the lifting connection block is able to accurately recover the horizontal position of the detection discharge plate after being tilted.

Figure 6:
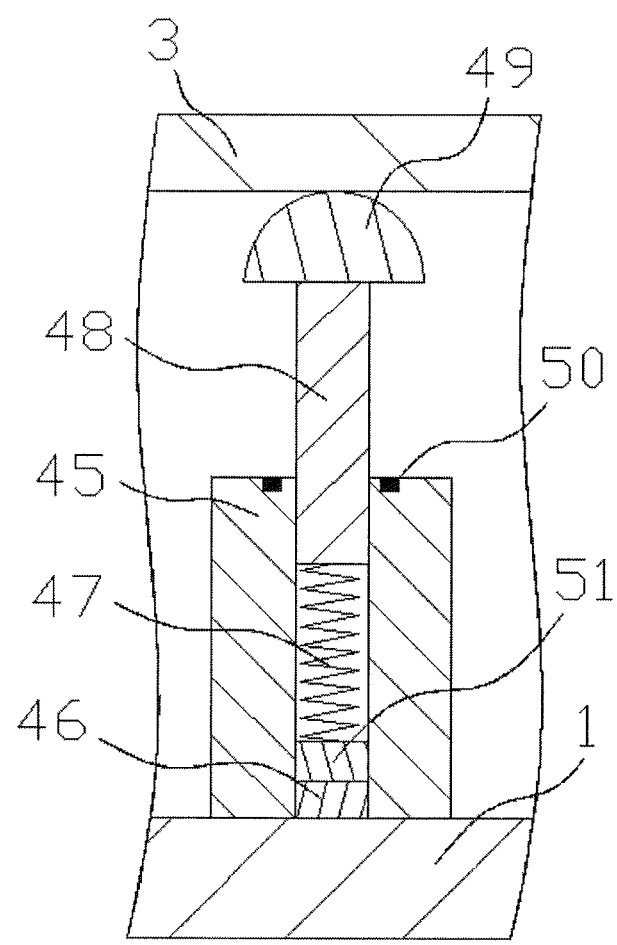
FIG. 6 is the structure schematic view of the slope measuring device.

As shown in FIG. 6, the slope measuring device (8) comprises a slope measuring sleeve (45) arranged at the bottom of the detection box (1), the slope measuring sleeve (45) is internally provided with a slope measuring hole, the bottom of the slope measuring hole is provided with a pressure gauge (46), and the slope measuring hole is sleeved and cooperated with a slope measuring ejector (48), the lower part of the slope measuring ejector (48) is connected with a slope measuring spring (47), the upper part of the slope measuring spring (47) in connected with a mounting block of measuring spring (51) cooperated with the pressure gauge (46), the upper part of the slope measuring ejector (48) is provided with a slope measuring top block (49) cooperated with the measuring discharge block (3), the measuring top block (49) is a hemisphere block with a diameter greater than the slope measuring ejector (48), and the slope measuring sleeve (45) is provided with a rangefinder (50) cooperated with the lower plane of slope measuring top block (49).

The structure design of the slope measuring device is ingenious, which doesn't affect the inclination of the detection discharge block and meanwhile is able to achieve double measurement through the pressure gauge and the rangefinder, ensuring the accuracy of the test.

As shown in FIG. 1, there are two connecting plates (11) which are sealingly cooperated with the front and rear side plates and the upper plate of the detection box (1), the center of both two connecting plates (11) is provided with a vent hole, the position where the upper limit plate (12) is located between the positioning interception block (5) and the right side plate of the detection box (1) is also provided with a vent hole, an air pipe (13) is arranged between the two connecting plates (11) to be cooperated with the vent hole, an air pump (14) is arranged below the upper plate of the detection box (1) in cooperation with a vent hole on the left side of the connecting plate (11), the position in the detection box (1) which is between the vent hole on the right connecting plate (11) and the vent hole on the upper limit plate (12) is connected with a first temperature tester (15) through brackets, and the outer side of the air pipe (13) is provided with a second temperature tester (16).

The design that the air pipe is cooperated with the vent hole is able to draw the hot air exhausted by the computer host, and the heat dissipation capability of the computer host is able to be detected through the design of the first temperature tester and the second temperature tester.

As shown in FIG. 1, the right part of the bottom plate of the detection box (1) is provided with a sealing spring (9) with a vertical direction, the sealing spring (9) is connected with a lower sealing block (10) sealingly cooperated with the right side plate and the front and rear side plates of the detection box (1), and the left end of the lower sealing block (10) is fittingly cooperated with the lower right part of the detection discharge block (3).

The design of the lower sealing block is able to ensure the detection accuracy of the first temperature tester and the second temperature tester.

The overall operation for the accurately positionable computer host power-on detection machine is as follow: the whole device is assembled firstly then the computer host (4) to be detected is put on the detection discharge block (3) through the manual or robotic arm and the rear side of the computer is made on the right of the detection discharge block (3), after that, through the different elongation of the left and right lifting cylinders (41), the detection discharge block (3) is tilted downward to the right so that the computer host (4) is slipped to the right and intercepted by the positioning interception block (5), after then the positioning and clamping screw rod (22) is driven by the positioning and clamping motor (21) to rotate, thereby driving the positioning and clamping column (24) to adjust two lifting cylinders (41) to the same elongation and making the detection discharge block (3) horizontal, then the detection discharge block (3) is descended to make the reset movable block to be inserted into the inner side of the reset fixed block so that the accurate reset of the detection discharge block (3) is completed, after that then two lifting cylinders (41) are lifted to make the host (4) stick to the upper limit plate (12) so that the positioning of the host detection (4) place is completed, then the detection feed block (33) is driven by the detection feed cylinder (32) to move left, thereby driving the detection insert block (34) to move left to be inserted into the power socket of the host (4). Observe whether the host machine is powered on, and meanwhile check whether the contact sensor generates induction signal. If the host machine is powered on and the induction signal is generated, the electrical performance and depth of the power socket will be proved good; otherwise, it will be proved unqualified. After the accurately positionable computer host power-on detection machine has been run a while, the air pump (14) is started to draw the hot air exhausted between the host (4) and the right side plate of the detection box from a vent hole. In the process of drawing air, the heat dissipation performance of the host can be judged by combining the values measured by the first temperature tester and the second temperature tester with the running time of the host; after that the detection discharge block (3) is driven by the lifting cylinder (41) to descend back to the original position, during which the reel is released by the drawstring collecting reel (37) to make the detection mounting block fall down and whether the host is powered on can be observed. After that then through adjusting the different elongation of two lifting cylinders, the detection discharge block (3) is gradually tilted toward the left to push the slope measuring top block (49) down and the pressure gauge (46) generates a pressure value, and meanwhile, the height of the lower surface of the slope measuring top block (49) is measured by the rangefinder, and the slope at which the host and the power socket are apart is judged by the values when the host is powered off and the value of the rangefinder, thereby judging the tightness specification of the power socket of the host (4) to complete the whole detection.

It should be understood that in the present invention the term "comprises", "comprising" or any other variants thereof is intended to encompass a non-exclusive inclusion, such that a process, method, article, or device that comprises a plurality of elements includes not only those elements but also other elements that are not explicitly listed, or elements that are inherent to such a process, method, item, or device.

The principles and embodiments of the present invention have been described herein with reference to specific examples, and the description of the above examples is only to aid in understanding the method of the present invention and its core idea. The above description is only a preferred embodiment of the present invention, and it should be noted that due to the finiteness of the textual expression, there is an infinitely specific structure objectively. It will be apparent to those skilled in the art that a number of modifications, modifications, or variations may be made without departing from the principles of the invention, and the technical features described above may be combined in an appropriate manner. These improvements, modifications, or combinations, or the direct application of the inventive concepts and technical solutions to other applications without modification, should all be considered to be within the scope of the present invention.

What is claimed is:

1. An accurately positionable computer host power-on detection machine, comprising a detection box (1) with an opening on the left side, the detection box (1) is internally connected with a detection discharge block (3) through a lifting device (2), the right part of the detection discharge block (3) is provided with a positioning interception block (5), the height of the positioning interception block (5) is the same as a host (4), and the center of the positioning interception block (5) is provided with a detection port of 0.6-0.8 times the size of a rear side plate of the host (4), the inner side of an upper plate of the detection box (1) is connected with an upper limit plate (12) through a connecting plate (11), the detection box (1) is provided with a positioning and clamping device (7) cooperated with left and right side plates of the host (4), and the inner side of a right side plate of the detection box (1) is provided with a detection device (6) which enables a detection insert block (34) to move horizontally left and right.

2. The accurately positionable computer host power-on detection machine in accordance with claim_1, wherein the positioning and clamping device (7) comprises three positioning and clamping motors (21) arranged side by side in the detection box (1) through brackets, and each of the positioning and clamping motors (21) is connected with a positioning and clamping screw rod (22) which runs forward and backward and passes through front and rear side plates of the detection box (1), both the positions where the positioning and clamping screw rod (22) passes through the front and rear side plates of the detection box (1) are sleeved and cooperated with a positioning and clamping movable block (23), and the winding directions of the two positions are opposed to each other, the outer sides of the front and rear side plates of the detection box (1) are provided with a supporting block of the positioning and clamping movable block (25) cooperated with the positioning and clamping movable block (23) through a sliding rail and a sliding slot, the positioning and clamping movable block (23) is connected with a positioning and clamping column (24) capable of being inserted into the detection box (1), and the inner end of the positioning and clamping column (24) is of a circular arc shape, and the heights of the three positioning and clamping columns (24) on the same side are all different.

3. The accurately positionable computer host power-on detection machine in accordance with claim_1, wherein the detection device (3) comprises a detection mounting block (31) arranged in the inner side of the right side plate of the detection box (1), the detection mounting block (31) is connected with a horizontally-oriented detection feed cylinder (32), the detection feed cylinder (32) is connected with a detection feed block (33), a detection insert block (34) is embedded in the center of the detection feed block (33) and exceeds the left side of the detection feed block (33), the detection insert block (34) is cooperated with a power socket of the host (4) and the length which the detection insert block_(34) exceeds the detection feed block (33) is the same as the depth of the power socket, the left side of the detection feed block (33) is provided with a contact sensor, the detection insert block (34) is connected with an electrical connection wire (35) which passes through the detection box (1), and the electrical connection wire (35) is connected with an external power supply.

4. The accurately positionable computer host power-on detection machine in accordance with claim 3, wherein the detection mounting block (31) is mounted upon the detection box (1) and the upper part of the detection mounting block (31) is connected with a detection movable drawstring (36) capable of passing through the detection box (1), the detection movable drawstring (36) is connected to a drawstring collecting reel (37) arranged on the outer side of the detection box (1), the drawstring collecting reel (37) is connected with a collecting reel motor; the inner upper part of the right side plate of the detection box (1) is provided with a detection positioning block (38), the lower part thereof is provided with a detection limit block_(39), both the detection positioning block (38) and the detection limit block (39)_with the right side plate of the detection box (1) respectively form a downwardly opening detection positioning groove and an upwardly opening detection limit groove, the downwardly opening detection positioning groove is cooperated with the upper part of the detection mounting block (31) in a gapless plug-in way, the upwardly opening detection limit groove is cooperated with the detection mounting block (31) with a gap, and the lower part of the detection positioning block (38) is an inclined plane inclined to the upper right.

5. The accurately positionable computer host power-on detection machine in accordance with claim_4, wherein the lifting device (2) comprises a lifting cylinder (41) hinged separately on the left and right parts of the lower surface of the detection discharge block (3), and the left part on a bottom plate of the detection box (1) is provided with a slope measuring device (8) cooperated with the detection discharge block (3).

6. The accurately positionable computer host power-on detection machine in accordance with claim 5, wherein the lower part of the detection discharge block (3) is fixedly connected with a lifting connection block (42), the lifting connection block (42) is hinged with a lifting cylinder (41), both the lower left and right sides of the lifting connection block (42) are provided with a reset movable block (43), and the right and left sides of the main body of the lifting cylinder (41) are provided with a reset fixed block (44) fittingly cooperated with the reset movable block (43).

7. The accurately positionable computer host power-on detection machine in accordance with claim 5, wherein the slope measuring device (8) comprises a slope measuring sleeve (45) arranged at the bottom of the detection box (1), the slope measuring sleeve (45) is internally provided with a slope measuring hole, the bottom of the slope measuring hole is provided with a pressure gauge (46), and the slope measuring hole is sleeved and cooperated with a slope measuring ejector (48), the lower part of the slope measuring ejector (48) is connected with a slope measuring spring (47), the lower part of the slope measuring spring (47) is connected with a mounting block of measuring spring (51) cooperated with the pressure gauge (46), the upper part of the slope measuring ejector (48) is provided with a slope measuring top block (49) cooperated with the measuring discharge block (3), the slope measuring top block (49) is a hemisphere block with a diameter greater than the slope measuring ejector (48), and the slope measuring sleeve (45) is provided with a rangefinder (50) cooperated with the lower plane of the slope measuring top block (49).

8. The accurately positionable computer host power-on detection machine in accordance with claim_1, wherein there are two connecting plates (11) which are sealingly cooperated with the front and rear side plates and the upper plate of the detection box (1), the center of the two connecting plates (11) is provided with a first vent hole, the position where the upper limit plate (12) is located between the positioning interception block (5) and the right side plate of the detection box (1) is provided with a second vent hole, an air pipe (13) is arranged between the two connecting plates (11) to be cooperated with the first vent hole, an air pump (14) is arranged below the upper plate of the detection box (1) on the left side of the air pipe (13), the position in the detection box (1) which is on the right side of the first vent hole and above the second vent hole is connected with a first temperature tester (15) through brackets, and the outer side of the air pipe (13) is provided with a second temperature tester (16).

9. The accurately positionable computer host power-on detection machine in accordance with claim 8, wherein the right part of the bottom plate of the detection box (1) is provided with a sealing spring (9) with a vertical direction, the sealing spring (9) is connected with a lower sealing block (10) sealingly cooperated with the right side plate and the front and rear side plates of the detection box (1), and the left end of the lower sealing block (10) is fittingly cooperated with the lower right part of the detection discharge block (3).

* * * * *